(12) United States Patent
Toomre et al.

(10) Patent No.: US 10,303,738 B2
(45) Date of Patent: *May 28, 2019

(54) QUANTITATIVE ANALYSIS AND VISUALIZATION OF SPATIAL POINTS

(71) Applicant: Yale University, New Haven, CT (US)

(72) Inventors: Derek K. Toomre, New Haven, CT (US); Brian T. McNellis, Waterbury, CT (US)

(73) Assignee: Yale University, New Haven, CT (US)

( * ) Notice: Subject to any disclaimer, the term of this patent is extended or adjusted under 35 U.S.C. 154(b) by 245 days.

This patent is subject to a terminal disclaimer.

(21) Appl. No.: 15/196,322

(22) Filed: Jun. 29, 2016

(65) Prior Publication Data

US 2016/0306773 A1    Oct. 20, 2016

Related U.S. Application Data

(63) Continuation of application No. 14/176,186, filed on Feb. 10, 2014, now Pat. No. 9,384,170, which is a continuation of application No. PCT/US2012/049836, filed on Aug. 7, 2012.

(60) Provisional application No. 61/521,537, filed on Aug. 9, 2011.

(51) Int. Cl.
G06F 17/50    (2006.01)
G06F 17/18    (2006.01)
G06K 9/00     (2006.01)

(52) U.S. Cl.
CPC .......... *G06F 17/18* (2013.01); *G06F 17/5009* (2013.01); *G06K 9/0014* (2013.01)

(58) Field of Classification Search
CPC .... G06F 17/18; G06F 17/5009; G06K 9/0014
See application file for complete search history.

(56) References Cited

U.S. PATENT DOCUMENTS

| | | | |
|---|---|---|---|
| 6,195,659 B1 * | 2/2001 | Hyatt | G06K 9/6218 |
| 6,944,338 B2 * | 9/2005 | Lock | G01N 15/1456 |
| | | | 382/168 |
| 9,384,170 B2 * | 7/2016 | Toomre | G06F 17/18 |
| 2003/0009470 A1 * | 1/2003 | Leary | G06F 17/30333 |
| 2006/0004753 A1 * | 1/2006 | Coifman | G06F 17/30675 |
| 2009/0254316 A1 * | 10/2009 | Tillman | G06F 17/5009 |
| | | | 703/2 |

* cited by examiner

*Primary Examiner* — Dwin M Craig
(74) *Attorney, Agent, or Firm* — Saul Ewing Arnstein & Lehr LLP; Kathryn Doyle; Brian R. Landry

(57) ABSTRACT

A method for analyzing spatial point patterns and visualizing the results is presented. The method includes simulating at least one point set within a region using a point process, dividing the region into a plurality of elements, determining scores for both real data and simulated data for each element by weighting the point sets within a domain of a predetermined kernel. The method further includes comparing scores for each element, computing confidence intervals for at least one confidence level having a predetermined statistical significance; and providing a visualization to identify clusters and exclusion zones.

16 Claims, 17 Drawing Sheets

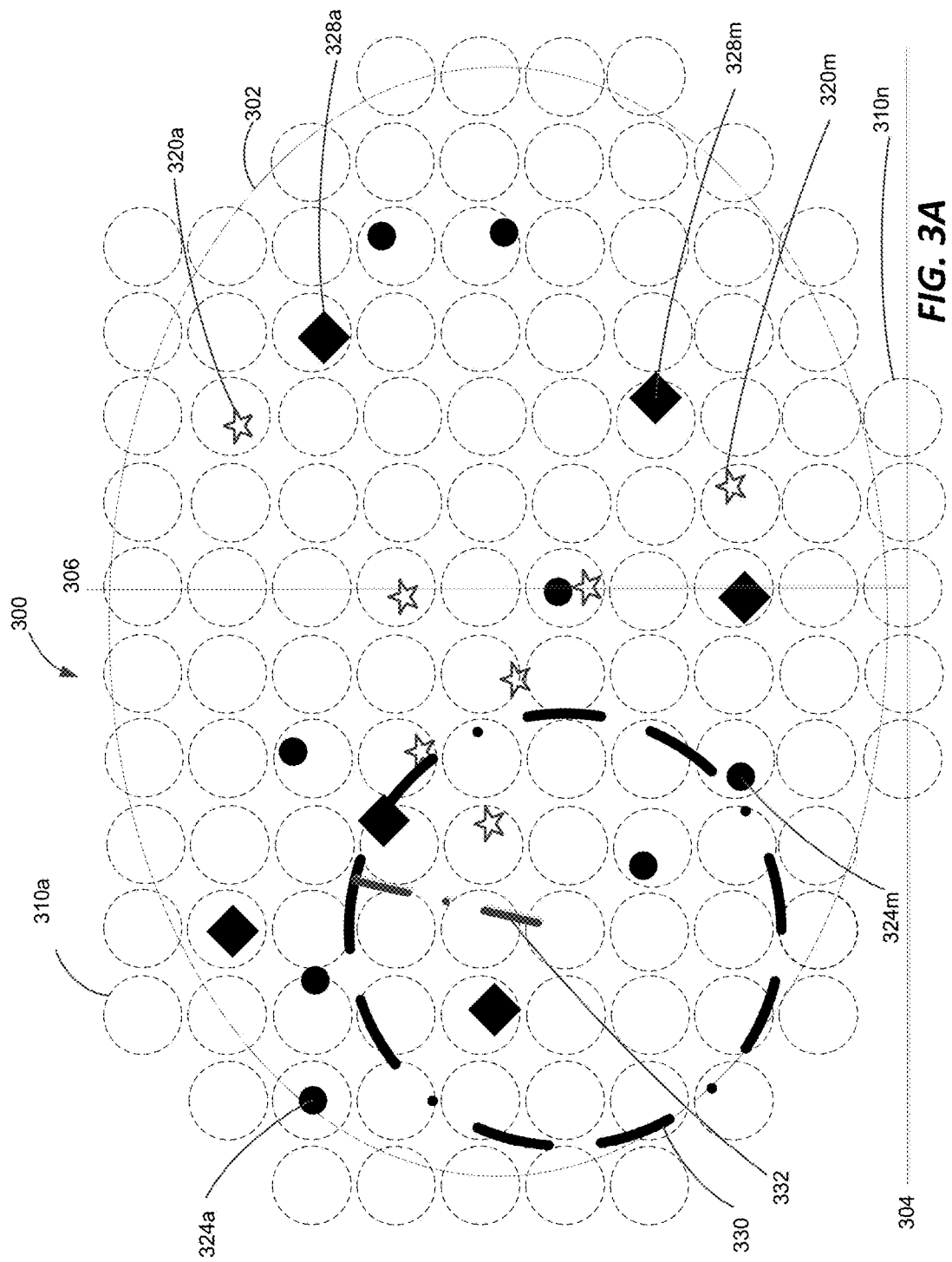

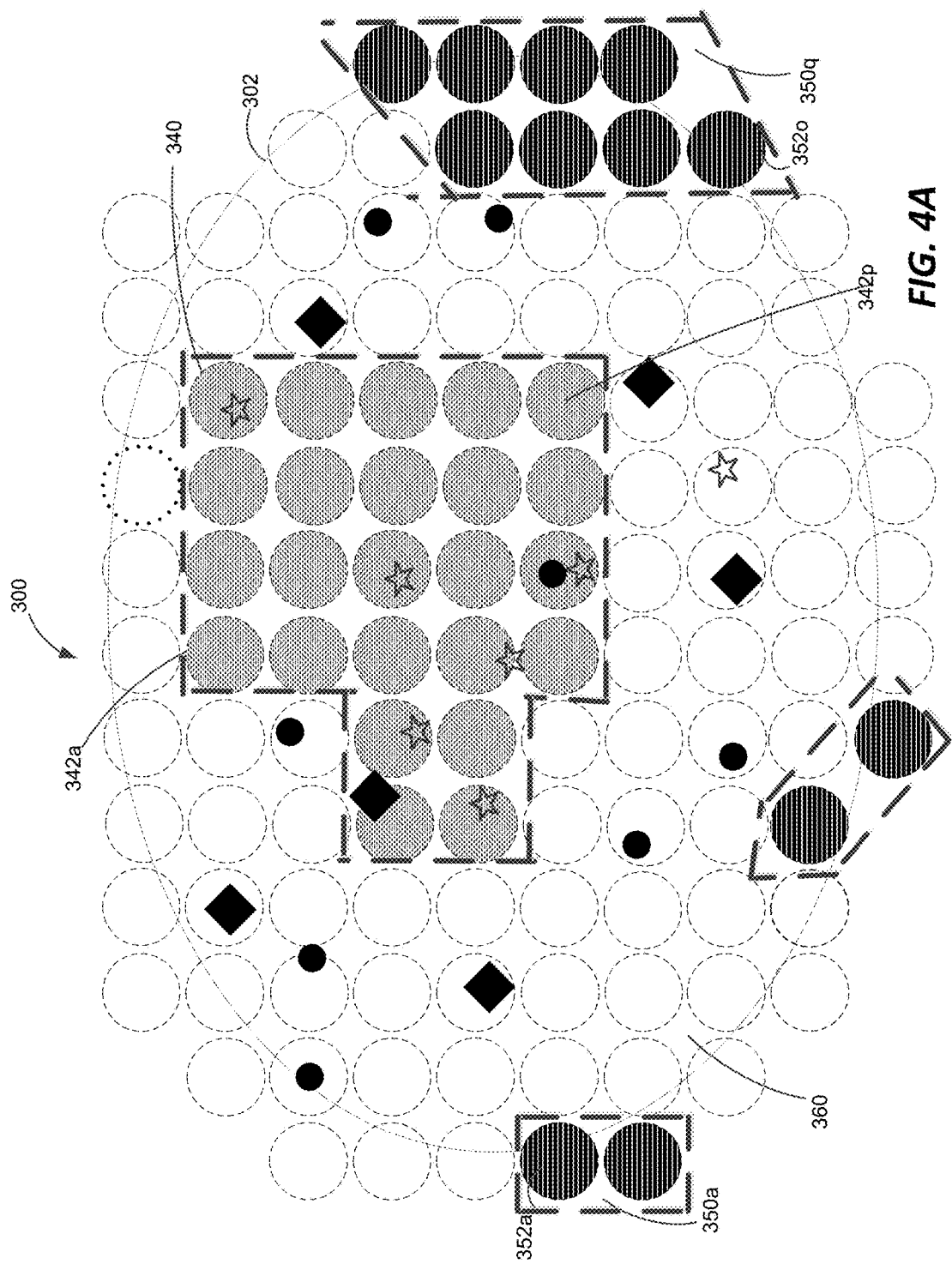

QUANTITATIVE ANALYSIS AND VISUALIZATION OF SPATIAL POINTS

CROSS-REFERENCE TO RELATED APPLICATIONS

This application is a continuation of application Ser. No. 14/176,186, filed Feb. 10, 2014, now U.S. Pat. No. 9,384, 170 issued Jul. 5, 2016, which is a continuation of U.S. PCT Application Serial No. PCT/US2012/49836, filed 7 Aug. 2012, titled "Quantitative Analysis and Visualization of Spatial Point," which claims priority under to U.S. Provisional Patent Application Ser. No. 61/521,537 filed on Aug. 9, 2011, titled "Quantitative Cluster Scan (QC scan)" The contents of the prior applications are hereby incorporated by reference in their entirety.

TECHNICAL FIELD

Embodiments of the present disclosure relate generally to the analysis of point data sets and the identification of clusters.

BACKGROUND

Often it is useful to identify the locations of "hot spots" (or clusters) and "cold spots" (e.g. zones of sparseness or exclusion) in a spatial point pattern in a statistically correct and computationally efficient way. One example is an analysis of the spatial distribution of exocytosis events in cells. However, other applications include monitoring patterns of human behavior, epidemiology of diseases distributions, assessing risk of an earthquake, military surveys, cell based screens, etc. The ability to identify unusual patterns in datasets representing these applications has a large commercial value.

Conventional spatial analysis techniques do not offer the flexibility, practicality, and rigor required for certain applications. Spatial statistics methods (such as Ripley's K function, FIG. 1) are often vulnerable to bias due to edge effects because areas near the edge are likely to have fewer points in their proximity than areas far from the edge. These deficiencies can be difficult to correct. Many methods also rely on specific assumptions that do not work well for all types of data and are quite complex to compute. FIG. 1 shows Ripley's K function used to analyze exocytosis events, for example, similar to those shown in the cell in FIG. 7. The K function counts the number of neighbors each data point has at a given spatial scale (the maximum distance between a point and a neighbor). Line 12 indicates the K function of the real data plotted against the spatial scale (also called the radius). When line 12 is within the envelope formed by lines 14 and 16, the distribution of the data is not significantly different from the distribution of homogeneous random points belonging to a spatial Poisson point process. When line 12 is above the envelope, the data are significantly clustered, and when line 12 is below, the data are significantly dispersed. Here, Ripley's K function is above the envelope at all scales, indicating that the points are significantly clustered at all scales, a conclusion which can be drawn by inspecting exocytosis events. Ripley's K function also cannot identify the presence of large areas void of exocytosis events, and Ripley's K function cannot identify the location of specific regions of interest (either hot spots or cold spots) within the data.

Simple heat map visualizations are commonly used to provide a more practical representation of spatial point data. Generally, areas of high and low density are displayed using different colors or intensities to provide a visually intuitive map of the data. However, a simple heat map method does not use a good statistical basis for identifying truly high- or low-density areas in the data, giving possibly misleading results. The highest density areas may not have significantly high density when compared to the expected density, but heat map displays would generally exaggerate the significance of such regions because they lack a solid statistical basis.

An exploratory method with better statistical grounding is the Geographical Analysis Machine (GAM), which is a grid-based method of identifying local clusters in spatial point data. The GAM method involves dividing the region into a regular grid, placing circles of various radii at the grid locations, counting the number of points within each of the circles, and identifying those circles with a significantly high number of points. The method is useful for identifying clusters, but it is a simple method suffering from several limitations. Although Monte Carlo simulations can be used to identify clusters, only simple comparison methods utilizing rankings (e.g. percentile rankings) have been suggested to test for statistical significance. Most applications and derivatives of the GAM have used analytical methods to identify significant circles using theoretical models of the Poisson process and other simple point processes; however, many useful applications require testing against more complicated models that are not analytically tractable and require more complex simulation techniques than have been applied to the GAM. The GAM also produces many false positives in some cases because of the difficulty of correcting for multiple testing. Secondly, the GAM does not deal well with edge effects, suffering from much the same problems as Ripley's K function because of the GAM's reliance on theoretical models. Because of this, important features of data near the edge are often lost using the GAM. GAM also, therefore, has difficulty with regions that may contain holes or other discontinuities. Thirdly, the method is designed only to identify clusters, not exclusion zones, holes, and other low-density areas in the data. Fourthly, the GAM is intended to be used with geographic information systems (GIS) and geographic-scale data, making it difficult, if not impossible, to apply to data at other scales, such as biological data from individual cells or data describing the location of astronomical objects, such as stars and galaxies. Finally, the visualization methods used to display the results of GAM are typically imprecise, as generally all significant circles at all radii are drawn, producing a crowded display, or all circles of the same arbitrarily chose size are drawn, again producing a slightly less crowded display.

An evaluation of spatial analysis methods in the scientific literature provides no existing method that offers the flexibility, practicality, and rigor for handling large point sets. Importantly, computation power is now so great that stochastic type studies are no longer necessarily limiting.

SUMMARY

Quantitative analysis and visualization of spatial points (QAV) as disclosed herein provides techniques for analyzing spatial point patterns to identify hot spots (clusters) and cold spots (zones of exclusion). By comparing the real data to simulations, QAV can identify and provide a visualization of statistically significant hot spots and cold spots while avoiding the problem of edge effects. QAV is highly adaptable, able to self-optimize to determine the best parameters with which to analyze the data, and it can be used with any spatial point pattern, regardless of the source or the underlying point process. Techniques disclosed herein rigorously both interpret and visualize spatial point patterns in a way that is automated, avoids artifacts (edge effects) and can adapt to non-uniform distribution of a second parameter (e.g. population density).

In one embodiment, a technique for analyzing spatial point patterns in a region includes receiving a point set, simulating at least one point set within the region using a point process, dividing the region into a plurality of elements, determining a first score for each element of the plurality of elements by weighting the point set within a domain of a predetermined kernel and determining a second score for each element by weighting the at least one simulated point set within the domain of the predetermined kernel. The technique further includes comparing, for each element, the first score to the second score by computing confidence intervals at each element for at least one confidence level having a predetermined statistical significance and visualizing at least one of the plurality of elements having a higher score relative to its confidence interval as belonging to a cluster and at least one of the plurality of elements having a lower score relative to its own different confidence interval as belonging to an exclusion zone. Such a technique automatically identifies clusters and exclusion zones while avoiding bias due to edge effects. Corrections for multiple testing, such as the method of Benjamini and Hochberg for controlling the false discovery rate (FDR), can be applied to eliminate false positives.

A system for analyzing spatial point patterns in a region, as disclosed herein, includes a host processor coupled to memory, the memory storing instructions that when executed on the host processor cause the system to perform receiving a point set, simulating at least one point set within the region using a point process, dividing the region into a plurality of elements, determining a first score for each element of the plurality of elements by weighting the point set within a domain of a predetermined kernel and determining a second score for each element by weighting the at least one simulated point set within the domain of the predetermined kernel. The system further includes instruction to perform comparing, for each element, the first score to the second score, computing confidence intervals for at least one confidence level having a predetermined statistical significance and visualizing at least one of the plurality of elements having a higher score relative to one of the confidence intervals as belonging to a cluster and at least one of the plurality of elements having a lower score relative to a different confidence interval as belonging to an exclusion zone.

Such a system provides a way to analyze a wide range of data including data gathered from vesicle fusion events in cells measured in nanometers or micrometers, demographic data measured in kilometers, and astronomical data measured in light years, while most existing spatial point analysis methods are not designed to be as flexible or applied to such a wide range of spatial scales. The ability to identify both high-density and low-density areas simultaneously and to display them in an intuitive, heat map-style display while having robust statistical grounding significantly increases the utility of QAV compared to other methods such as GAM or simple heat maps. The simulation approach of QAV allows it to quickly self-optimize the parameters of the analysis, ensuring robust performance. Most methods rely on ad hoc statistical analysis, intended to be used only with specific, often simple theoretical models or utilizing simplistic simulation methods. QAV works with any model at any scale while correcting for edge effects by sampling from arbitrary spatial distributions an using more complex methods to perform hypothesis testing at each element. In one embodiment, kernel density estimation (KDE) is used to estimate the probability density function (PDF) of the distribution of scores at each element, which is then used to compute a p-value or confidence interval for identifying whether an element is significant. KDE allows for QAV to be used with any model and any data set without relying on the assumptions required for parametric estimation of the PDF and while mitigating the potential bias due to sampling caused by simpler methods (e.g., a ranking method for GAM). Furthermore, the potential for false positives could be minimized in one embodiment by correcting for multiple testing using a method such as Benjamini and Hochberg's for controlling FDR. The heat map visualization style used by QAV can also be used to show multiple levels of significance together, allowing for flexible and robust comparison of hot spots and cold spots. QAV is uniquely suited to comparing the spatial distribution of points to another distribution, such as that of a covariate (e.g. population density), or comparing two subsets of points in the data set (such as fusion events before and after treatment in a cell). By considering the number of significant elements identified by QAV, the goodness of fit of the data to a specified model can be quantified in a unique, non-obvious manner to identify large-scale differences from the expected distribution, as well as the local differences identified on an element-by-element basis. The flexibility and robust nature of QAV combined with its intuitive visualization and the large-scale meta-analysis of its results makes it a useful tool for the analysis of large point sets at any scale.

Embodiments of QAV provide a useful visual output based on a quantitative, statistical analysis of the data without being biased by edge effects. The methods described herein are largely independent of general assumptions about the underlying spatial process and capable of self-optimizing to choose the best parameters to fit the data. The QAV system provides good results and is particularly useful for inherently noisy point data sets (i.e., data sets having a low signal to noise (S/N) ratio).

Other arrangements of embodiments of the invention that are disclosed herein include software programs to perform the method embodiment steps and operations summarized above and disclosed in detail below. More particularly, a computer program product is one embodiment that has a non-transitory computer-storage medium including computer program logic encoded thereon that when performed in a computerized device provides analysis and display of a plurality of data sets on a display screen as explained herein. The computer program logic, when executed on at least one processor with a computing system, causes the processor to perform the operations (e.g., the methods) indicated herein as embodiments of the invention. Such arrangements of the invention are typically provided as software, code and/or other data structures arranged or encoded on a computer readable medium such as an optical medium (e.g., CD-ROM), hard disk or other medium such as firmware or microcode in one or more ROM or RAM or PROM chips or as an Application Specific Integrated Circuit (ASIC) or as downloadable software images in one or more modules, shared libraries, etc. The software or firmware or other such configurations can be installed onto a computerized device to cause one or more processors in the computerized device to perform the techniques explained herein as embodiments of the invention. Software processes that operate in a collection of computerized devices, such as in a group of data communications devices or other entities can also provide the system of the invention. The system of the invention can be distributed between many software processes on several data communications devices, or all processes could run on a small set of dedicated computers or on one computer alone.

Still other arrangements of embodiments of the invention that are disclosed herein include a server system connected to a network capable of performing the method embodiment steps and operations summarized above and disclosed in detail below. More generally, a server may be one of a number of computer devices that together in a distributed fashion perform the method embodiment steps, including servers, embedded systems, personal computers, and mobile devices such as handheld computers, smart phones, and other convergent mobile devices such as iPods and iPads.

It is understood, that the embodiments of the invention can be embodied strictly as a software program, as software and hardware, or as hardware and/or circuitry alone, such as within a data communications device. Note that each of the different features, techniques, configurations, etc. discussed in this disclosure can be executed independently or in combination. Accordingly, the present invention can be embodied and viewed in many different ways. Also, note that this summary section herein does not specify every embodiment and/or incrementally novel aspect of the present disclosure or claimed invention. Instead, this summary only provides a preliminary discussion of different embodiments and corresponding points of novelty over conventional techniques. For additional details, elements, and/or possible perspectives (permutations) of the invention, the reader is directed to the Detailed Description section and corresponding figures of the present disclosure as further discussed below.

BRIEF DESCRIPTION OF THE DRAWINGS

The foregoing will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

FIG. 3A is a diagram of a region including a real data set and simulated data sets according to embodiments herein;

FIG. 4A is a diagram showing cluster and exclusion zone identification in the data set of FIG. 3;

DETAILED DESCRIPTION

Embodiments of the presently described method and apparatus for analyzing spatial point patterns comprise three basic steps: simulation, scanning and comparison. After acquiring "real data" points to form a map, the map is divided into a grid of elements. The elements can correspond to uniformly sized (e.g., pixels or voxels) or variable-sized states on a map) objects. One or more simulations are run to produce sets of randomly sampled points distributed on the grid of elements. In one embodiment, Monte Carlo simulations are used, with each set containing the same number of points as the original real data set. The simulations provide a comparison data set which has been surprisingly found to enhance cluster detection or identification without significant edge effects. This comparison dataset can be sampled from a distribution describing complete spatial randomness, but it can also be sampled from other specific distributions.

After the real point data set has been received and the simulated sets have been generated, a weighting function is applied to the data set within a domain of a kernel for each element within a grid of elements in the region of interest. A region can have any shape, including having voids, and the region can be a one-dimensional (1D), two-dimensional (2D), three-dimensional (3D) or higher dimensional space. In the following description and figures, 2D regions are used for clarity. The weighting function is applied around each element for the number of real points within the kernel domain (e.g. within a circle of a given radius centered on the element). This process assigns a value to the element as its score or local density. The process is repeated for each simulated set independently, storing a separate score at every element for each simulated set. The kernel domain in one embodiment is a circle, but the kernel could be a Gaussian or any other volume element.

After the scores for the real data point set and the at least one simulated point set around each of the plurality of elements have been determined, the score(s) for the at least one simulated point set is (are) used to estimate the expected distribution of the scores at each of the plurality of elements. Elements whose real score is significantly different from the expected score at a certain level of statistical significance (determined by using p-values or confidence intervals) are identified.

Figure 1:
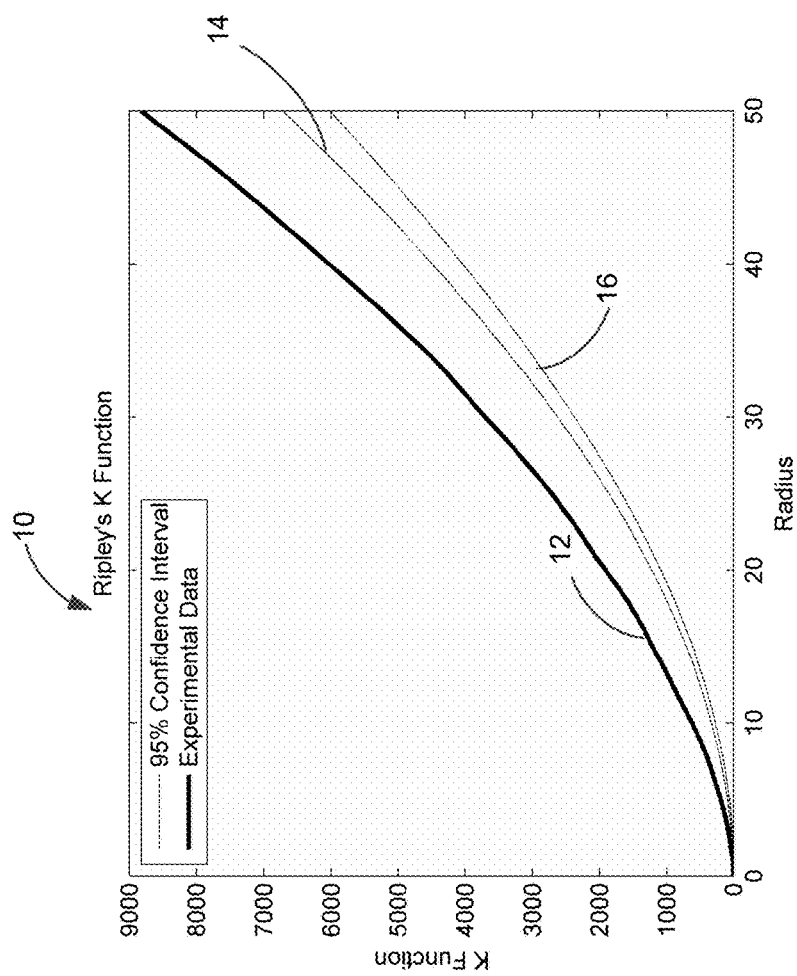
FIG. 1 is a graph of Ripley's K function used in a conventional manner.
Figure 2:
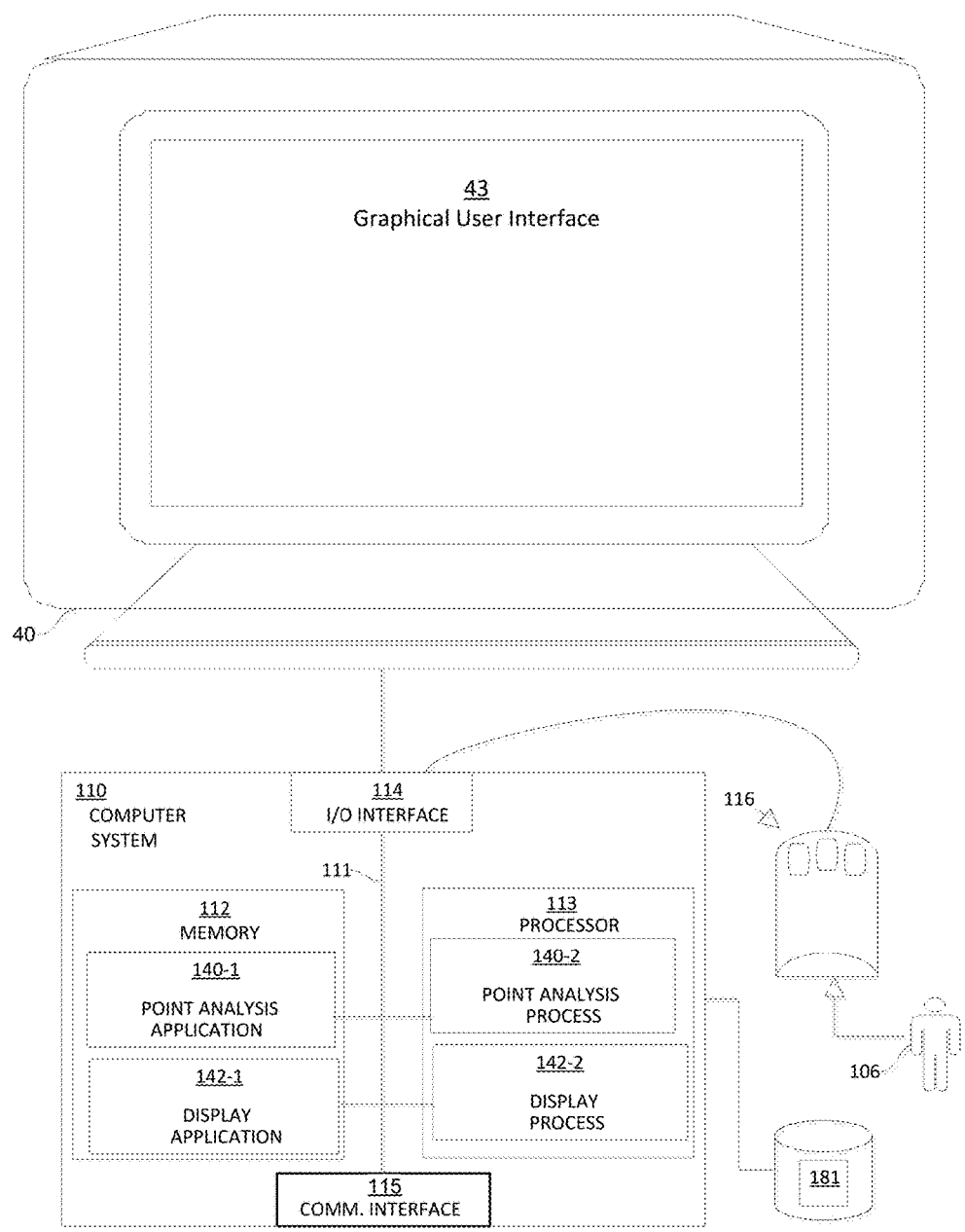
FIG. 2 is a block diagram illustrating an exemplary architecture of a computer system in a computer/network environment according to embodiments herein.

FIG. 2 is an exemplary block diagram illustrating an architecture of a quantitative analysis and visualization of spatial points (QAV) system 110 (also referred to as QAV system 110) that executes, runs, interprets, operates or otherwise performs a point analysis process 140-2 (e.g. an executing version of a point analysis application 140-1) and a display process 142-2 (e.g. an executing version of a display application 142-1) as controlled or configured by user 106 according to embodiments herein.

Note that the QAV system 110 may be any type of computerized device such as a personal computer, a client computer system, workstation, portable computing device, console, laptop, netbook, television set-top box, camera, camcorder, network terminal, embedded processor, etc. This list is not exhaustive and is provided as an example of different possible embodiments. In addition to a single computer embodiment, QAV system 110 can include any number of computer systems in a network environment to carry the embodiments as described herein. Thus, those skilled in the art will understand that the QAV system 110 can include other processes and/or software and hardware components, such as an operating system that controls allocation and use of hardware resources, or multiple processors.

As shown in the present example, the QAV system 110 includes an interconnection mechanism 111 such as a data bus, motherboard or other circuitry that couples a memory system 112, a processor 113, an input/output interface 114, and a display 40. Repository 181 can optionally be used for storing documents and content both before and after processing. If so configured, the display 40 can be used to present a graphical user interface 43 of the QAV system 110 to user 106. An input device 116 (e.g., one or more user/developer controlled devices such as a keyboard, mouse, touch pad, touch sensitive screen, devices without keypads, speech input etc.) couples to the QAV system 110 and processor 113 through an input/output (I/O) interface 114. The QAV system 110 can be a client system and/or a server system. As mentioned above, depending on the embodiment, the point analysis application 140-1 and/or the point analysis process 140-2 can be distributed and executed in multiple nodes in a computer network environment, executed as a web application or performed locally on a single computer.

During operation of the QAV system 110, the processor 113 accesses the memory system 112 via the interconnect 111 in order to launch, run, execute, interpret or otherwise perform the logic instructions of the display application 142-1. Execution of the point analysis application 140-1 and the application 142-1 in this manner produces the point analysis process 140-2 and the display process 140-2. In other words, the display process 142-2 represents one or more portions or runtime instances of the display application 142-1 (or the entire display application 142-1) performing or executing within or upon the processor 113 in the QAV system 110 at runtime.

The point analysis application 140-1 and display application 142-1 may be stored on a computer readable medium (such as a floppy disk), hard disk, and electronic, magnetic, optical, or other computer readable medium. It is understood that embodiments and techniques discussed herein are well suited for other applications as well. Those skilled in the art will understand that the QAV system 110 may include other processes and/or software and hardware components, such as an operating system. Display 40 need not be coupled directly to QAV system 110. For example, the point analysis application 140-1 and display application 142-1 can be executed on a remotely accessible computerized device via the communication interface 115. The display 40 presents a rendered graphical user interface 43 that provides a display of point sets. The display 142 presents visualization of clusters and exclusion zones.

Note that the following discussion provides a basic embodiment indicating how to carry out functionality associated with the point analysis 140-1 and display 142-1 applications as discussed above and below. However, it should be noted that the actual configuration for carrying out the point analysis 140-1 and display 142-1 applications could vary depending on a respective application.

Now referring to FIG. 3, in one embodiment, a region 302 is divided into a grid of plurality of elements 310a-310m (also referred to as nodes 310a-310m and commonly as elements 310). Here the grid of elements is aligned with horizontal line 304 and vertical line 306 in two-dimensions, however it is understood that elements can be arranged in various configurations in multiple dimensions. The elements 310 can have any shape (e.g. square, cubic, hexagon, circle, or other shapes, including potentially ones of different size). Generally, smaller, uniform elements avoid bias caused by the shape and size. In some embodiments, small, square elements are best for visualization since these elements map well to pixels. Similarly, small circles are used to create a pointillism effect, and the small circles can overlap to cover most or all of the surface area of the region. Small circles reduce gaps between the elements which otherwise might produce misleading visualizations or results by leaving out parts of the region that belong to a hot spot or cold spot. In one embodiment, to facilitate visualization, the size of the elements 310 corresponds to the size of pixels. In other embodiments, the elements can be tessellated, non-uniform, non-polygonal, or non-tessellated. In other embodiments, the elements are square shaped for simplicity of calculation.

An acquired set of data points 320a-320m (represented by stars) within the region 302 is received to be processed. In one embodiment, at least one set of simulated points 324a-324m (represented by circles) is distributed in region 304 according to a given spatial point process, such as a Poisson process. Here a second set of simulated points 328a-328m (represented by diamonds) is also distributed in region 302 and is used in the point analysis process. It is understood that a large number of Monte Carlo simulations could be used and that the point process does not have to be a random point process.

In other embodiments, the point process used to generate the simulated point sets can be based on a predetermined process/distribution or a separate set of points or a subset of the points, from which a process/distribution can be generated. A Poisson process is the default case, the simplest null hypothesis. More complicated processes can be used for other applications. In still other embodiments, point processes which reflect a co-variate are used. The Poisson models assume a uniform landscape while other models which are based on data from a covariate or marked datasets may have a non-uniform distribution.

Figure 3B:
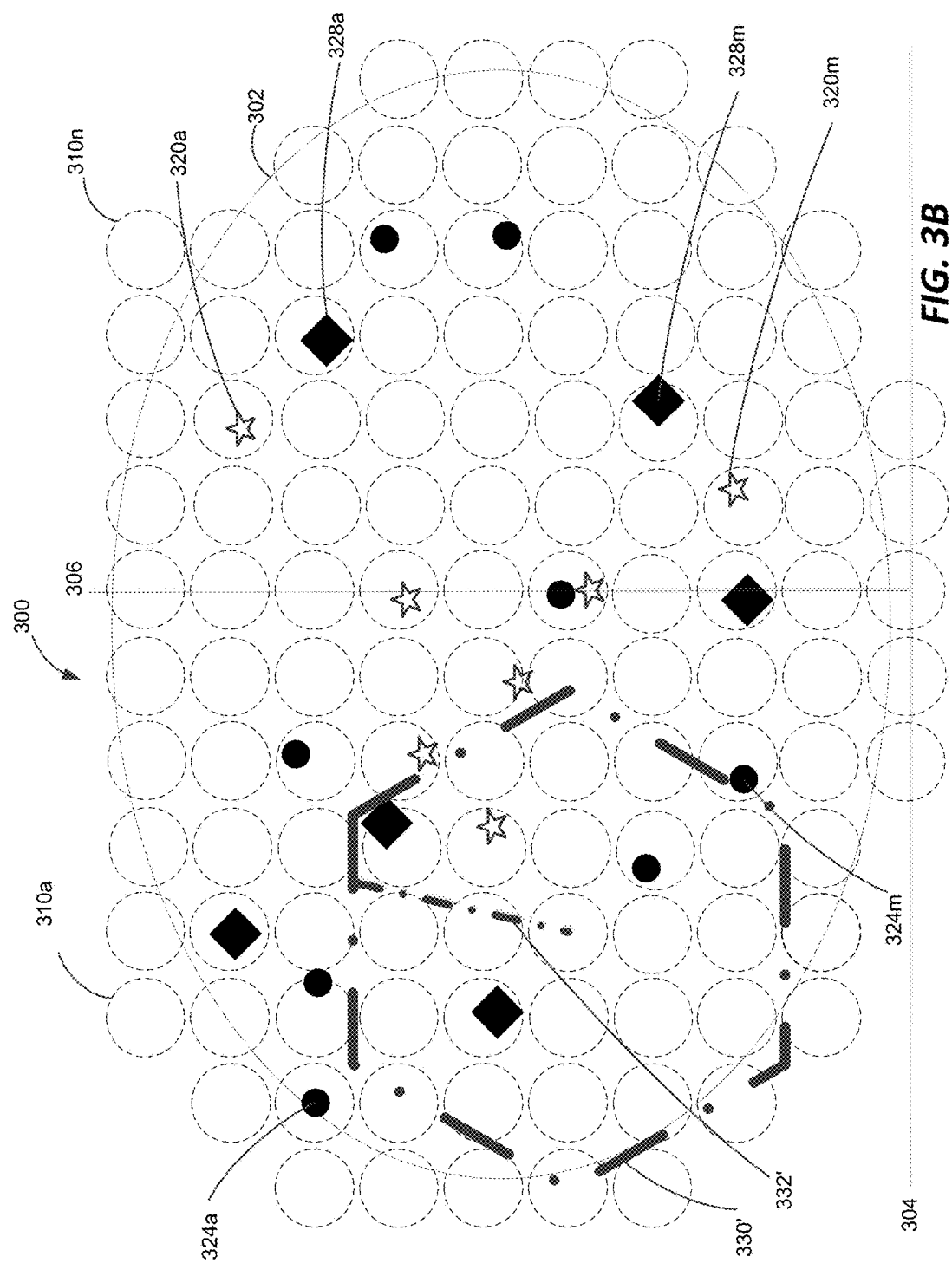
FIG. 3B is a diagram of a region including a real data set and simulated data sets of FIG. 3A and including a hexagonal shaped kernel according to an alternate embodiments.

FIG. 3B illustrates an alternate kernel 330', here a hexagonal shaped domain. In other embodiments, the kernel could have a square shaped domain with a pyramidal weighting function. In these embodiments, the kernel domain can span multiple dimensions including both space and time in order to correspond to the point set being analyzed. The kernel can be either continuous or discrete and can be either symmetrical or non-symmetrical.

Scores are computed for each element using each set of data points 320a-320n and set of simulated points 324a-324n and 328a-328n by counting the number of points within radius 332 (for a circular kernel 330) or effective radius 332' (the internal area of the hexagon for kernel 330') of each element 310a-310m and assigning that number or score to the element.

Points can be weighted relative to some variable (for example, distance from the element center) to provide a better visualization or to account for specific properties of the data. The weighting function (e.g. a Gaussian or a paraboloid), which can be continuous or discrete, assigns a weight to each point within the area of the kernel around the element. The score of the element is then determined by combining the weights in some way (e.g., addition).

FIG. 4A illustrates cluster 340 which includes elements 342a-342p and several exclusion zones 350a-350q which includes elements 352a-352o. Elements 342a-342p have a score computed as described above in conjunction with FIG. 3A having a higher score relative to a confidence interval at each element having a predetermined statistical significance and being a function of the scores of the simulated point set for each element. Likewise, the elements 352a-352o forming exclusion zones 350a-350q have a lower score relative to a confidence interval. Elements with scores that fall within the confidence interval are considered random, and form the background 360.

Figure 4B:
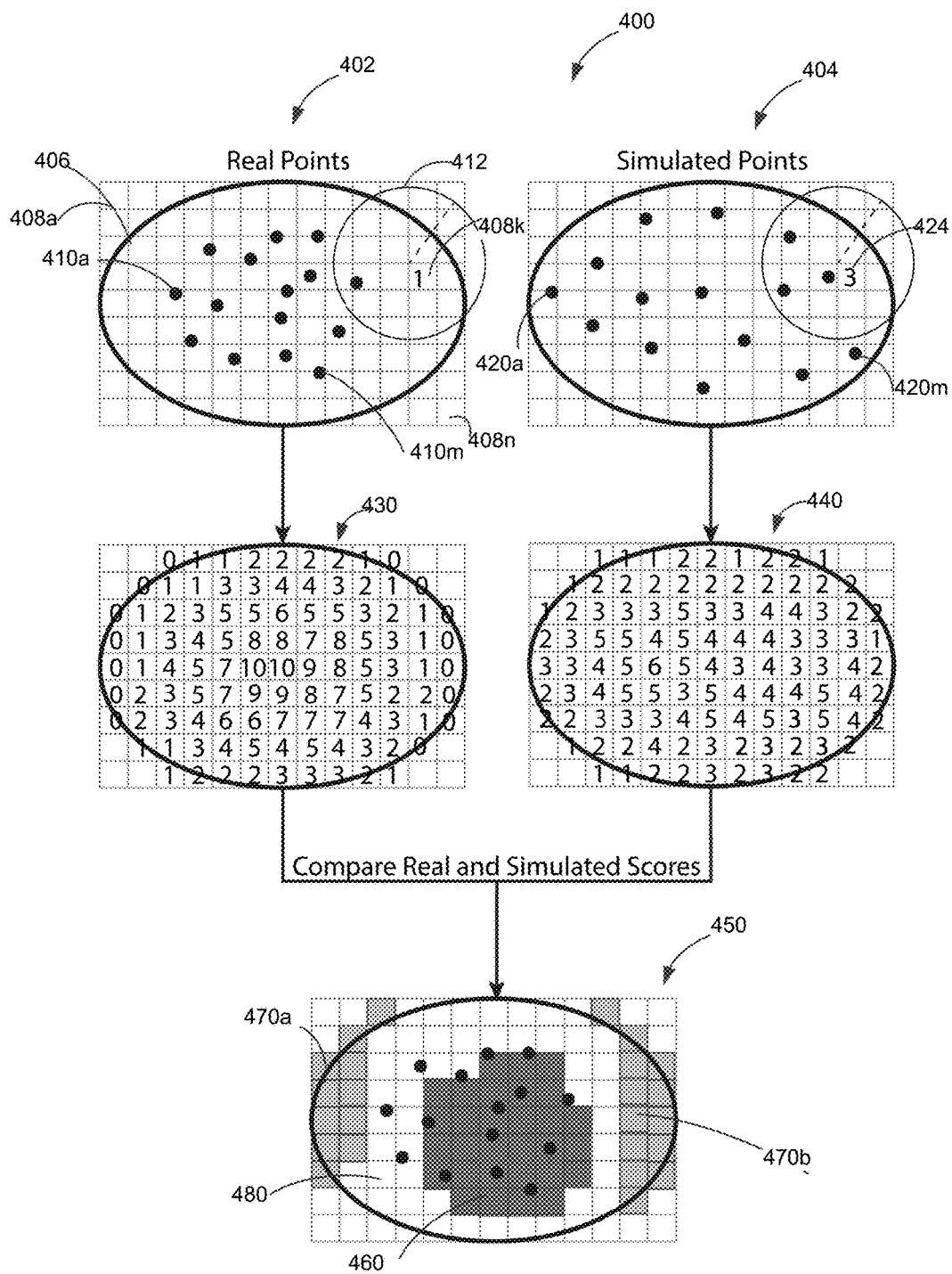
FIG. 4B is a numerical flow diagram showing score determination and cluster and exclusion zone identification in a data set according to embodiments herein.

FIG. 4B illustrates a numerical flow diagram 400 showing score determination and cluster and exclusion zone identification in a data set according to one aspect of the invention. Referring to FIG. 4B, point map 402 includes a plurality of points 410a-410m representing real data points shown in region 406. A set of simulated points 404 includes a plurality of simulated points 420a-420m. Here the region has been divided into a plurality of elements 408a-408n. A first score for element 408k is determined by weighting, here counting, the points within a domain of a predetermined kernel 412. The first score for element 408k is 1. A second score for element 408k is determined by weighting, here counting, the simulated points within the domain of the predetermined kernel 412. The second score for element 408k is 3. The first scores 430 are computed for each element in region 406, and the second scores 440 are computed for each element in region 406. The first scores 430 are compared to the second scores 440 to provide a visualization of the analysis 450 which includes the identification of a cluster 460 and exclusion zones 470a-470b. The background 480 (represented by white space) indicates elements with scores within the confidence intervals estimated from the second scores 440. The elements in cluster 460 have scores greater than the respective confidence intervals estimated from the second scores 440. The elements in exclusion zones 470a-470b have scores lower than the respective confidence intervals estimated from the second scores 440.

Figure 5:
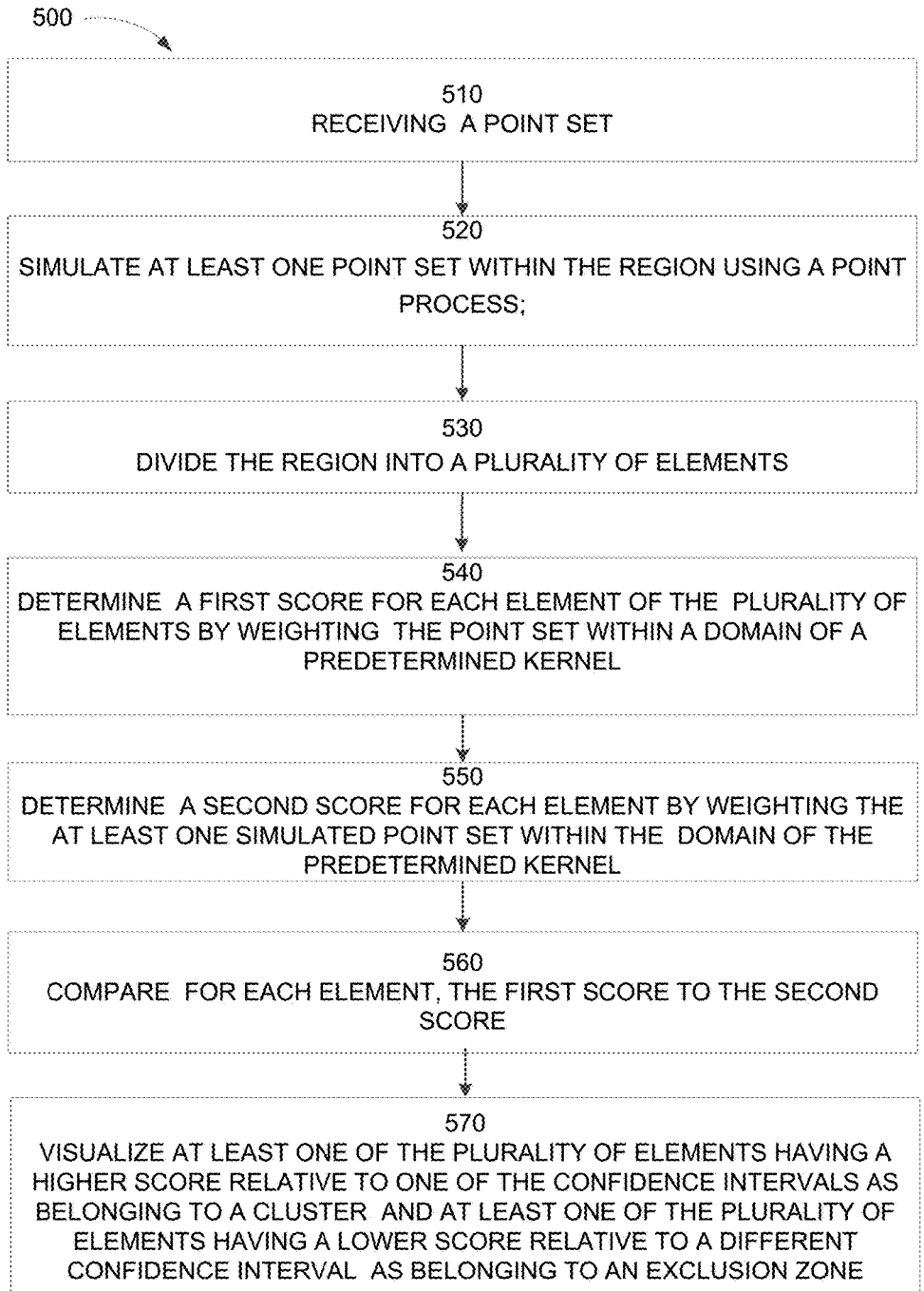
FIGS. 5-6 are flowcharts illustrating example processes according to embodiments herein.
Figure 6:
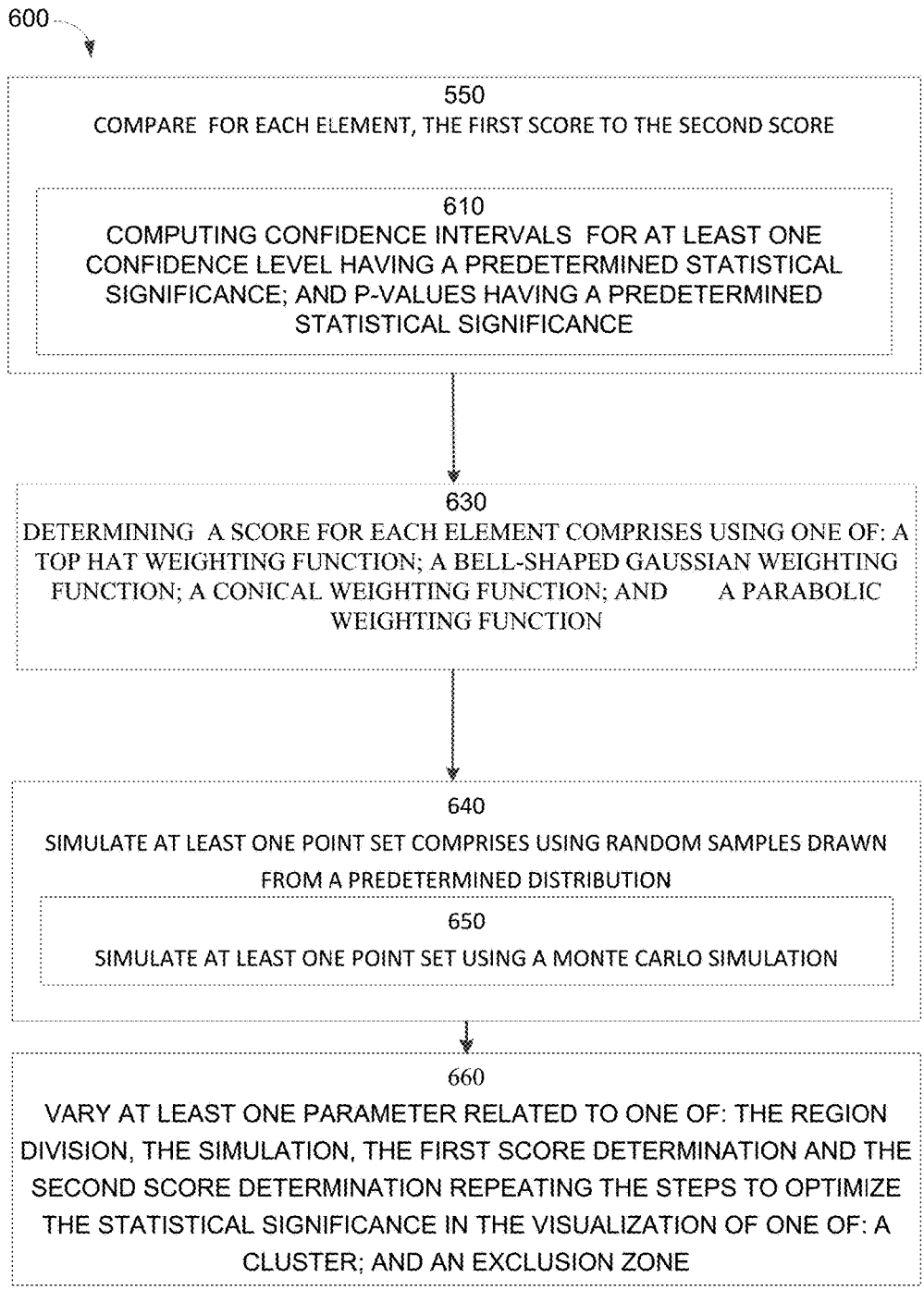

Functionality supported by computer system 110 and, more particularly, functionality associated with point analysis application 140 and display application 142 will now be discussed via flowcharts in FIG. 5 and FIG. 6. For purposes of the following discussion, flow diagrams of particular embodiments of the presently disclosed methods are depicted in FIGS. 5 and 6. The rectangular elements are herein denoted "processing blocks" and represent computer software instructions or groups of instructions. Alternatively, the processing blocks represent steps performed by functionally equivalent circuits such as a digital signal processor circuit or an application specific integrated circuit (ASIC). The flow diagrams do not depict the syntax of any particular programming language. Rather, the flow diagrams illustrate the functional information one of ordinary skill in the art requires to fabricate circuits or to generate computer software to perform the processing required in accordance with the present invention. It should be noted that many routine program elements, such as initialization of loops and variables and the use of temporary variables are not shown. It will be appreciated by those of ordinary skill in the art that unless otherwise indicated herein, the particular sequence of steps described is illustrative only and can be varied without departing from the spirit of the invention. Thus, unless otherwise stated the steps described below are unordered meaning that, when possible, the steps can be performed in any convenient or desirable order.

Referring now to FIG. 5, a method 500 for analyzing spatial point patterns in a region is shown. In the following description a point set is received to be analyzed. It is understood that various types of information can be the source of the point sets. Method 500 begins with processing block 510 which discloses receiving a point set. The point set of real data can be acquired from a number of sources. For biological cell studies the point set is generated by a TIRF microscope. Additionally, the point set includes, but is not limited to, a covariate dataset, a dataset having a non-uniform distribution and a marked dataset.

At step 520, at least one point set within the region using a point process is simulated. In some embodiments, the point process is a Poisson point process. In other embodiments, simulating at least one point set includes using random samples drawn from a predetermined distribution. The region is divided into a plurality of elements at step 530. It is understood that the plurality of elements can include multiple dimensions.

At step 540, a first score for each element of the plurality of elements is determined by weighting the point set within a domain of a predetermined kernel. The predetermined kernel can be a continuous kernel or a discrete kernel. The kernel can be isotropic having a radius greater than the radius of each of the plurality of elements. In certain embodiments, the predetermined kernel has a domain with a Gaussian shape around a point within the element. Weighting the point set includes, for example, counting the number of points within the domain of the predetermined kernel centered on the element. In some embodiments, determining a score for each element includes weighting the point set within a domain of a predetermined kernel using a top hat weighting function, a bell-shaped Gaussian weighting function, a conical weighting function or a parabolic weighting function.

In one embodiment, the elements are assigned a score based on how many nearby data points are present within the domain of the kernel. Effectively, each point is convolved/transformed by the kernel which can be continuous (e.g. a circle or Gaussian) or discrete (e.g., like a traditional kernel), and result of that convolution is assigned to the element as the score. Feedback from later steps is used to choose the best kernel parameters. This can be done to avoid bias caused by the user selecting arbitrary values of the parameters of the kernel. A random point set (or any point set simulated using the point process to be tested) can be processed multiple times, each time varying the parameters of the kernel (e.g. radius), and then comparing the results to the expected distribution as in the normal method. The analysis can then be repeated. The parameters for which the number of elements identified as significant is minimized are the optimal parameters for the data set. Then, the process on the real is repeated using the optimized parameters. Usually the effective domain of the kernel is larger than a single element, in contrast to some conventional methods that simply analyze only points within single elements. The parameter variations are used to optimize the parameters against some criteria (e.g. determine minimum number of simulations for convergence), and then repeating the analysis process for a final optimized visualization output.

At step 550, a second score for each element is determined by weighting the at least one simulated point set within the domain of the predetermined kernel. At step 560, for each element, the first score is compared to the second score. Comparing the first score to the second score includes, for example, computing confidence intervals at each element for at least one confidence level and computing p-values at each element and comparing them to a predetermined statistical significance. In some embodiments, the comparison can include any covariate having a non-uniform density.

Confidence intervals can be computed in several ways, including, but not limited to:

1) computing the upper and lower thresholds of the score that correspond to the ($\alpha/2$) and 1−($\alpha/2$) percentiles (e.g. 2.5 and 97.5) of the simulated scores; where $\alpha$ represent the significance level (e.g. 95% confidence means that $\alpha=0.05$).
2) fitting the simulated scores to a specific probability density (or mass) function (PDF, such as the gamma distribution) and computing the upper and lower thresholds of the score by determining the upper and lower thresholds at which the probability of a more extreme score (the area under the tails) is $\alpha/2$; and
3) using kernel density estimation (KDE) to fit a nonparametric probability distribution to the simulated scores and determining the upper and lower thresholds at which the probability of a more extreme score (the area under the tails) is $\alpha/2$.

Alternatively, the real score can be compared to the simulated scores by computing a p-value for the score and rejecting elements whose p-value is less than $\alpha/2$. Methods of computing the p-value are similar to those for computing confidence intervals, including, but not limited to:

1) computing the percentile of the real score within the distribution of simulated scores (the percentile is then the p-value):
2) fitting the simulated scores to a specific probability distribution and computing the probability of a more extreme score (i.e. computing the area under the closer tail), which is they-value;
3) using kernel density estimation to fit a nonparametric probability distribution to the simulated scores and computing the probability of a more extreme score as in (2) above.

In the simpler version of the p-value method, if the p-value of an element is less than $\alpha/2$, then the score of that element is significant. A more accurate method used in one embodiment controls the false discovery rate (the expected number of false positives) by identifying those elements whose p-values are small enough given a desired false discovery rate using the method of Benjamini and Hochberg.

In order to perform a goodness-of-fit test of the data against a given distribution, the number of elements identified becomes the test statistic. The given distribution can, for example, have complete spatial randomness (e.g., a Poisson process), or be a specific, non-random process, based on a covariate or a comparison of subsets of marked points. The null hypothesis is premised on the number of significant elements being the same as the number expected for a point set drawn from the given distribution (a point pattern belonging to the given process). If many simulated sets of points are drawn from the distribution of the null hypothesis and the analysis is repeated on each, and then the number of elements identified as significant is counted, a simulated sample of the expected number of significant elements is created, against which a comparison of the number of significant elements for the real data to the expected number of significant elements can be made. If there is no significant difference between the real and expected number of significant elements, then the proposed process/distribution fits the data. In some embodiments, the score of the real data at each element is compared to the simulated data based on a fit to a probability distribution function or other mechanism, for example, a percentile, using a process similar to that described above for the hypothesis tests at the individual elements.

Finally, at step 570, at least one of the plurality of elements having a higher score relative to the corresponding confidence interval(s) is visualized as belonging to a cluster, and at least one of the plurality of elements having a lower score relative to the corresponding confidence interval(s) is visualized as belonging to an exclusion zone. In one embodiment, the plurality of elements corresponds to a plurality of pixels to be visualized.

Now referring to FIG. 6, further details of for analyzing spatial point patterns in a region are shown. At step 610 confidence intervals for at least one confidence level or p-values to be compared to at least one level of statistical significance are computed for each element.

Scores for each element are determined by weighting the point set within a domain of a predetermined kernel comprises using one of: a top hat weighting function, a bell-shaped Gaussian weighting function, a conical weighting function and a parabolic weighting function at step 630. At step 650, point sets are simulated using Monte Carlo simulation.

At step 660, parameters related to the region division, the simulation, the first score determination, and the second score determination are varied over a given interval using a given increment. Then the analysis steps 520 through 560 are repeated to optimize the statistical significance in a visualization of the clusters and exclusion zones.

Case Study: Exocytosis in a Cell

Figure 7:
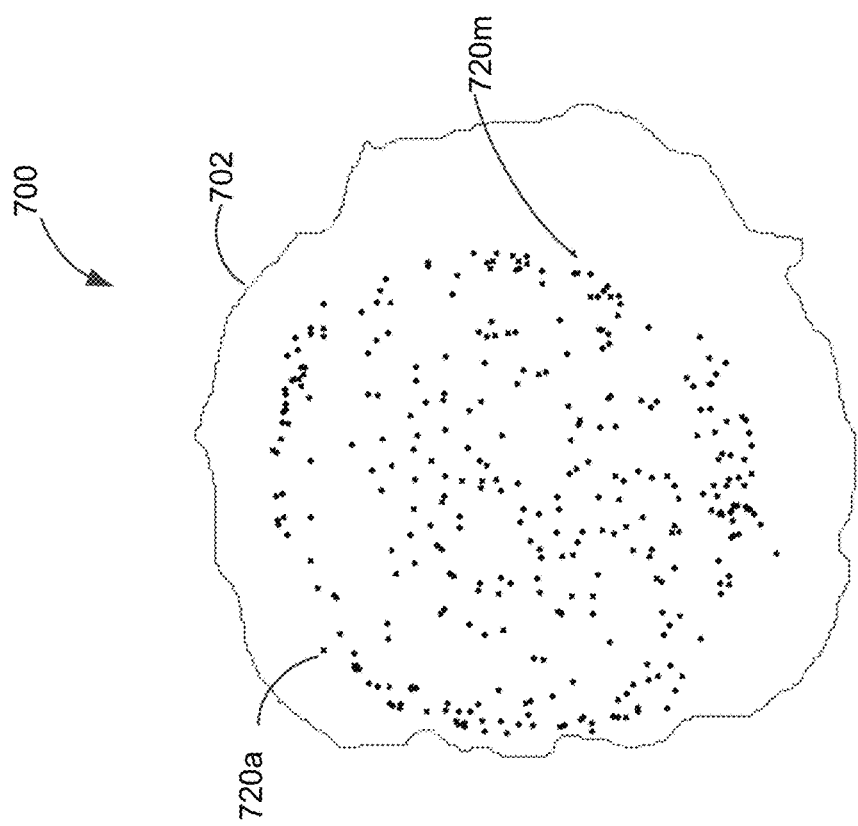
FIG. 7 is a diagram of an endothelial (EA) cell with exocytosis events within a defined cell region.

Now referring to FIG. 7, in one embodiment, data 700 representing a distribution of exocytosis events acquired from a TIRF (Total internal reflection fluorescence) microscope is shown. A point set including points 720a-720m (referred to as point set 720) is located within region 702. Here, the data is taken from an endothelial cell. A plurality of vesicle fusion events are identified and provide the point set 720 within region 702. Next, the boundary of the cell, region 702, is identified by techniques known in the art.

Figure 8C:
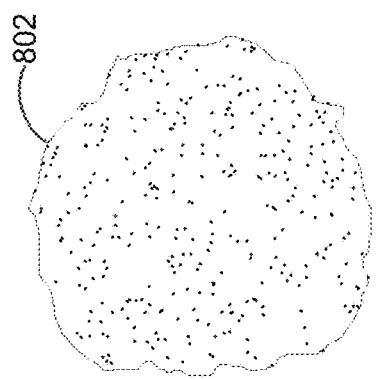
FIGS. 8A-8C show Monte Carlo simulations of a homogeneous spatial Poisson process generated for the cell region of FIG. 7 according to embodiments herein.
Figure 8B:
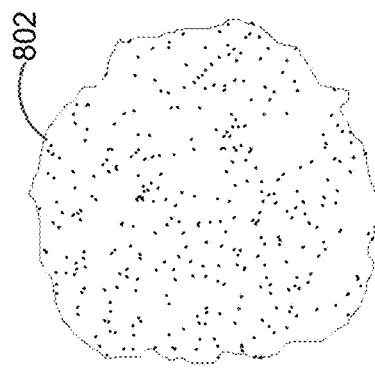
Figure 8A:
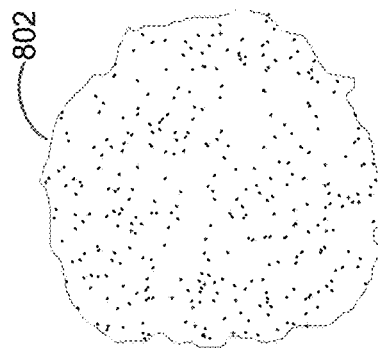

Now referring to FIGS. 8A-8C, three simulations 800, 810 and 820 (corresponding to analyzing the data of FIG. 7) belonging to 1,000 total Monte Carlo (MC) simulations of a homogeneous spatial Poisson process are shown. In a homogeneous spatial Poisson process, each point can be randomly assigned to any location within the region 802 (cell) with equal probability. There is no inherent sampling preference for one location over the other. This creates the uneven, random pattern shown above, which differs from a uniform distribution, in which all points are an equal distance apart, or a clustered distribution in which points are expected to aggregate. A point pattern that fits a spatial Poisson process approximates complete spatial randomness. In this embodiment, the search window radius was 25 pixels (where the length of 1 pixel is 189 nm) and used a Gaussian weighting function.

Figure 9:
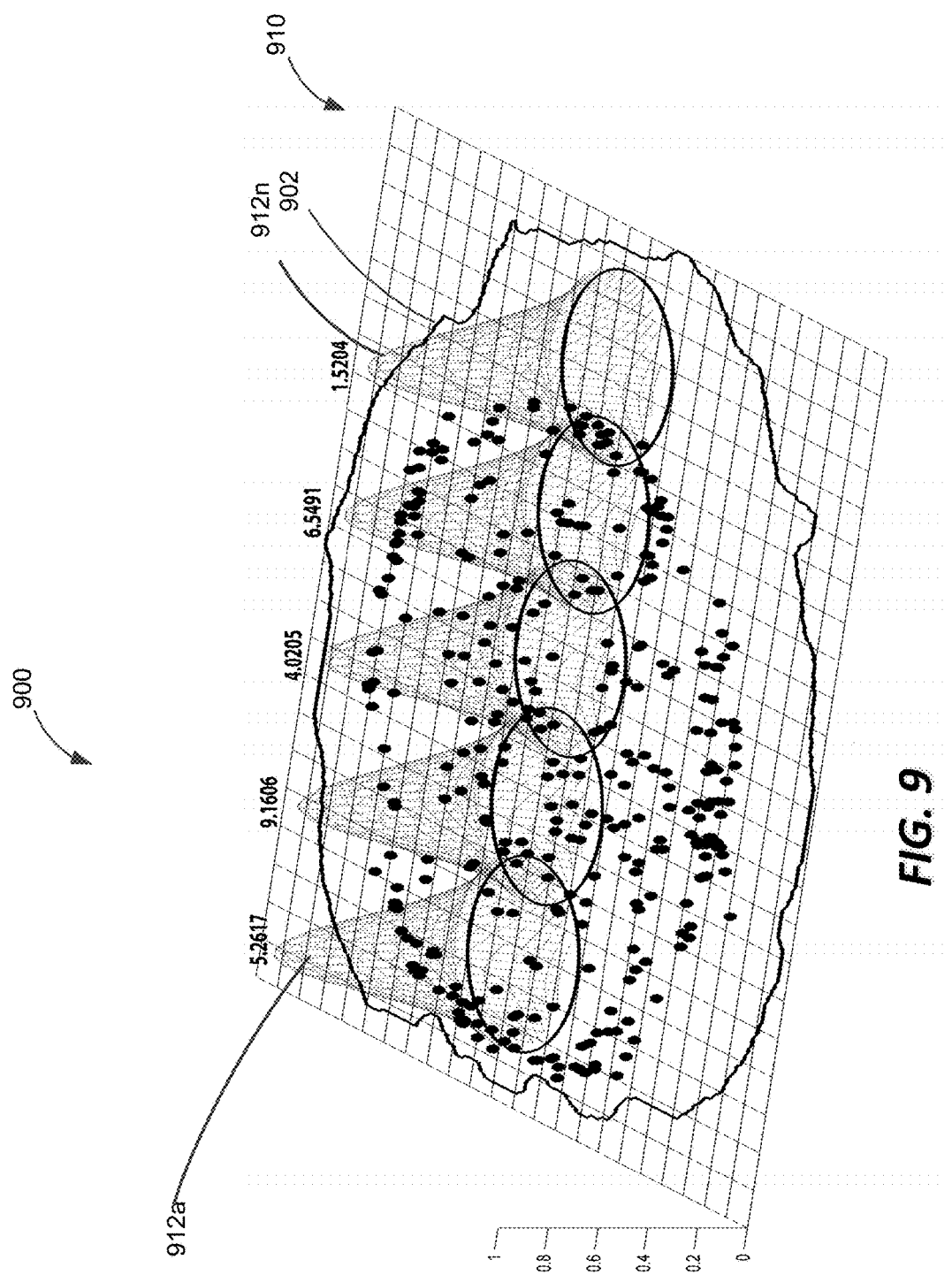
FIG. 9 represents the kernel weighting process at several elements in the cell region according to embodiments herein.

Now referring to FIG. 9, display 900 shows the real data point set within the cell region 902. Gaussian distributions 912a-912n represent a Gaussian kernel with maximum radius 25 pixels centered at 5 of the plurality of elements. The height of the kernel in the figure at a given distance from the center corresponds to the weight of a point located that distance from the center. Above the peak of each of the kernel functions is the score of the element, which is the sum of the weights of the points under the kernel. The elements shown are 10 times larger in each dimension than the actual elements used for the analysis.

Figure 10A:
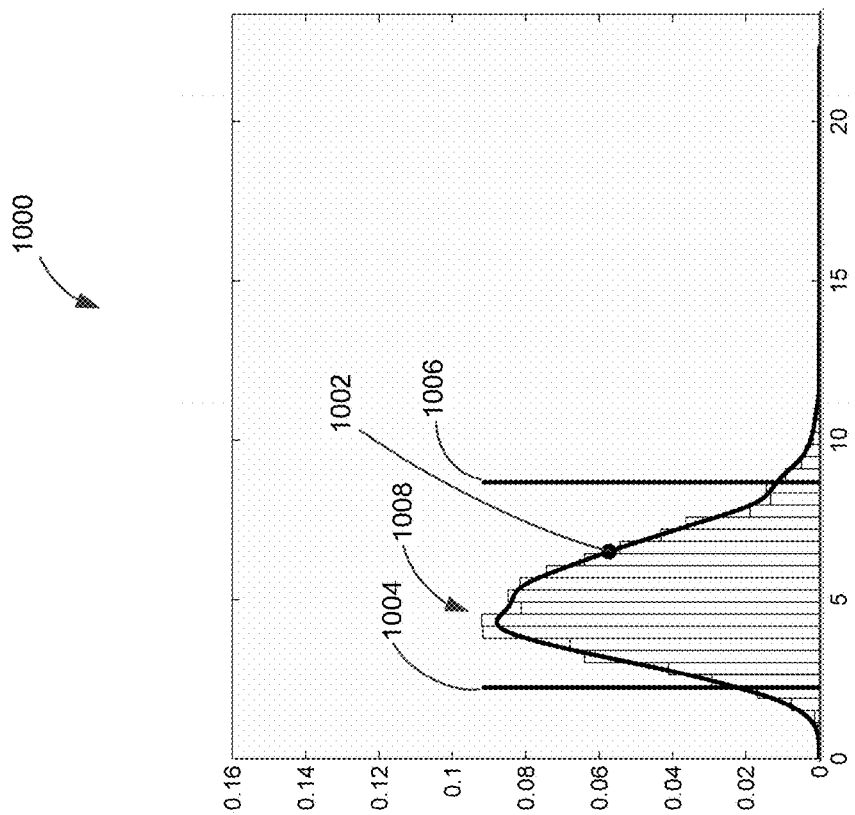
FIGS. 10A-10C illustrate histograms showing the frequency distribution of scores at three different pixels in the cell within a region of average density, a cluster, and an exclusion zone.
Figure 10B:
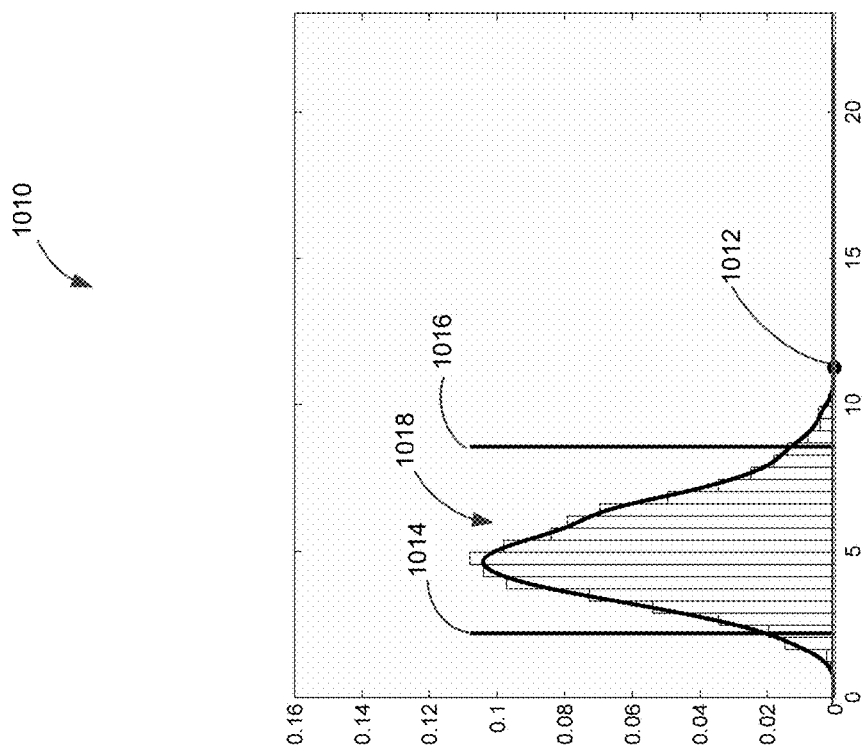
Figure 10C:
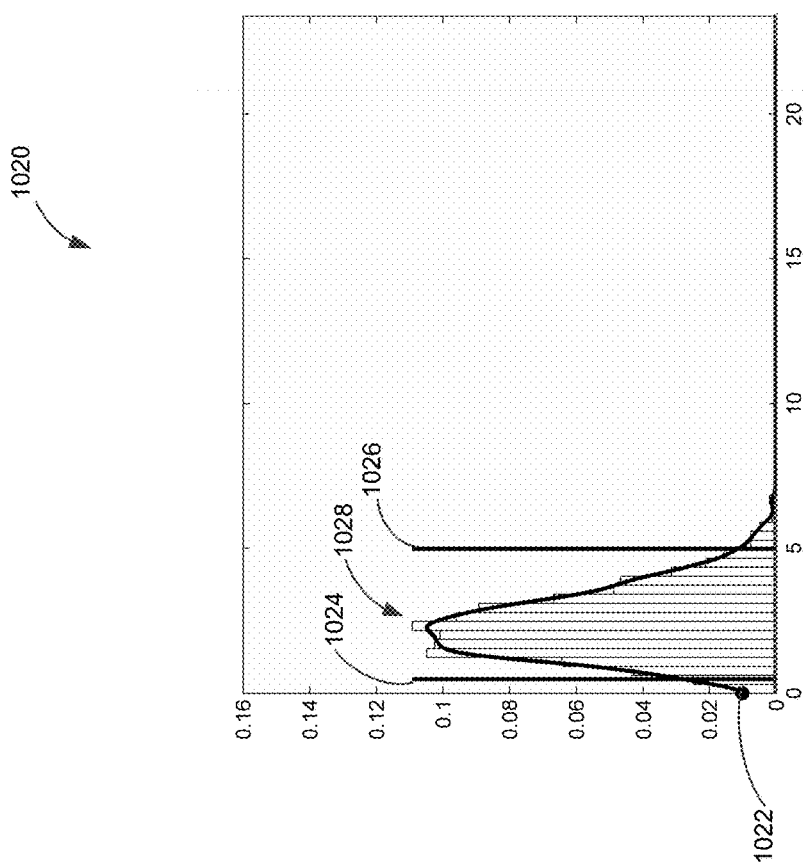

FIGS. 10A-10C illustrate histograms 1000, 1010 and 1020 showing the confidence intervals for specific elements in the grid 910 of FIG. 9. Now referring to FIG. 10A, the interval between lines 1004 and 1006 indicates a 95% confidence interval, and a point 1002 represents the actual score of the element. This element will be represented in the visualization shown in FIG. 11 as a random element, and its score is not considered significant. The dark black line drawn over the histogram is the kernel density estimate of the probability density function of the score at that element.

Now referring to FIG. 10B, the interval between lines 1014 and 1016 indicate a 95% confidence interval, and a point 1012 represents the actual score of the element. This element will be represented in the visualization shown in FIG. 11 as a high density element and will form part of a cluster. The dark black line drawn over the histogram is the kernel density estimate of the probability density function of the score at that element.

Now referring to FIG. 10C, the interval between lines 1024 and 1026 indicate a 95% confidence interval, and a point 1022 represents the actual score of the element. This element will be represented in the visualization shown in FIG. 11 as a low density element and will form part of an exclusion zone. The dark black line drawn over the histogram is the kernel density estimate of the probability density function of the score at that element.

Figure 11:
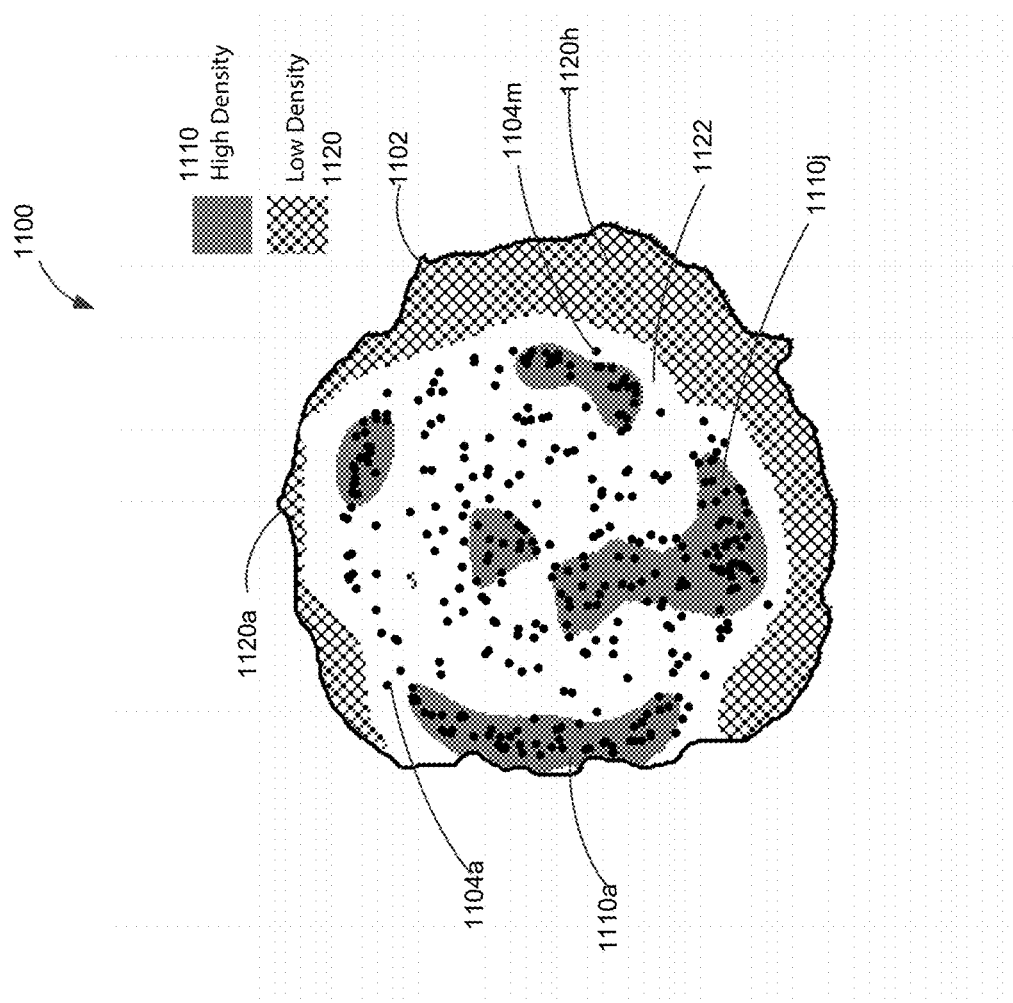
FIG. 11 is a display of QAV output for the above cell and exocytosis events of FIG. 7.

FIG. 11 is a visualization 1100 of the analysis of the cell of FIG. 7 illustrating the clustering of cell events and the absence of cell events according to one aspect of the invention. Referring to FIG. 11, the cell map visualization 1100 includes a plurality of points 1104a-1104m representing vesicle fusion events shown within the cell boundary 1102. The visualization of the analysis 1100 includes clusters 1110a-1110j indicating a high density and exclusion zones 1120a-1120h indicating a low density. The background 1122 (represented by white space) indicates elements with scores which are between the high and low density confidence interval limits.

In one embodiment, brighter shades of colors (e.g., red and blue) indicate greater confidence in clustering or exclusion zones, respectively, at a given element (i.e., pixel). The analysis can be repeated for the additional confidence intervals (e.g., 99% and 99.5% confidence intervals) to provide data to visualize the brighter colors. The elements in the analysis correspond to the pixels in the original image obtained from the TIRF microscope. At every element, the kernel is centered at the upper-left corner of the element (which is the same as the upper left corner of the pixel).

Here 1,000 simulations were used and the score of the event data for each element was compared to the C.I. of the corresponding element. If the real (fusion event) score is above the C.I., the elements are shown as part of a cluster 1110. If the real (fusion event) score is within the C.I., the distribution of points at that element is approximately random, and the elements are shown as part of background 1122. If the real (fusion event) score is below the C.I., the elements are shown as part of an exclusion zone 1120.

Figure 12B:
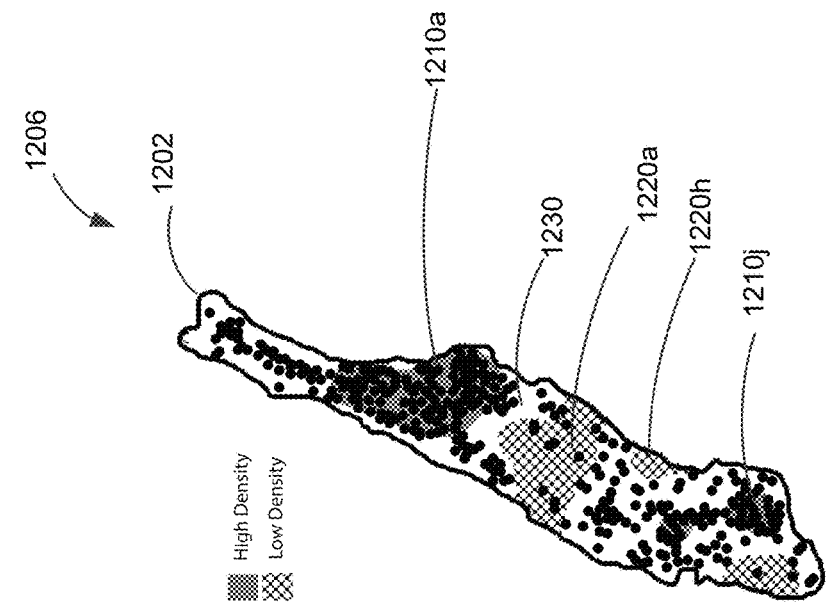
FIGS. 12A-12B illustrate the clustering of homicides in Manhattan according to one aspect of the invention.
Figure 12A:
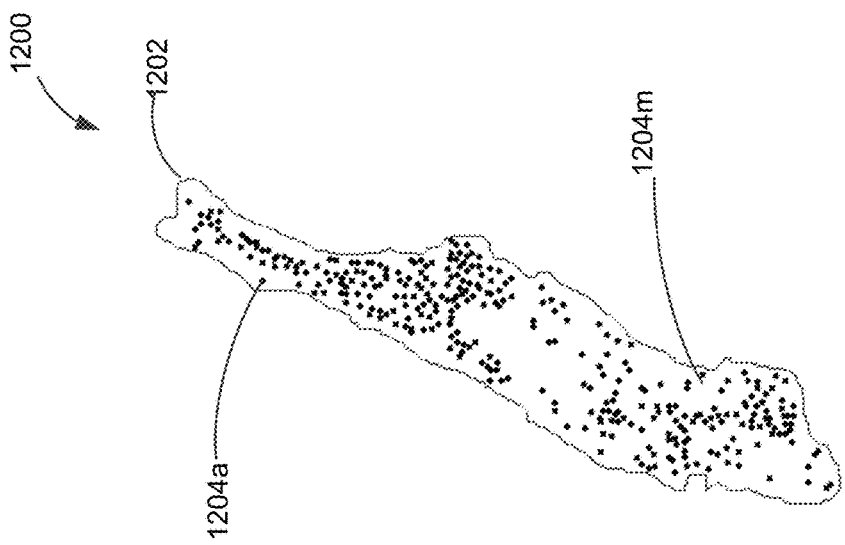

FIGS. 12A-12B illustrate the clustering of homicides in Manhattan according to one aspect of the invention. Referring to FIG. 12A, point map 1200 includes a plurality of points 1204a-1204m representing 327 homicides in Manhattan from 2003-2011 shown as region 1202. A visualization of the analysis is shown in FIG. 12B where the clusters 1210a-1210j indicate a high density and exclusion zones 1220a-1220h indicate a low density. The background 1230 (represented by white space) indicates elements with scores which are between the high and low density confidence interval limits Here, the confidence level is 98% with a false discovery rate (FDR) of 0.05, and 1000 simulations were used.

In yet other embodiments, data point sets that are sampled over time can be divided into temporal bins and these can be compared to each other to predict future spatial trends and detect if the spatial clusters/exclusions are stable over time or identify where they are spreading. For instance, in the crime map, homicides in 2003 can be compared to 2004 and other years to see how homicides may propagate over time, allowing the user to make future predictions. In still other embodiments, QAV could be applied to fields as diverse as criminology, epidemiology, and economics to analyze how spatial trends in, for example, homicides, flu epidemics, or housing prices are spreading over time. Using techniques described herein, it is possible to assign a certainty (p-value) as to how likely a forecast is to be accurate.

Figure 13:
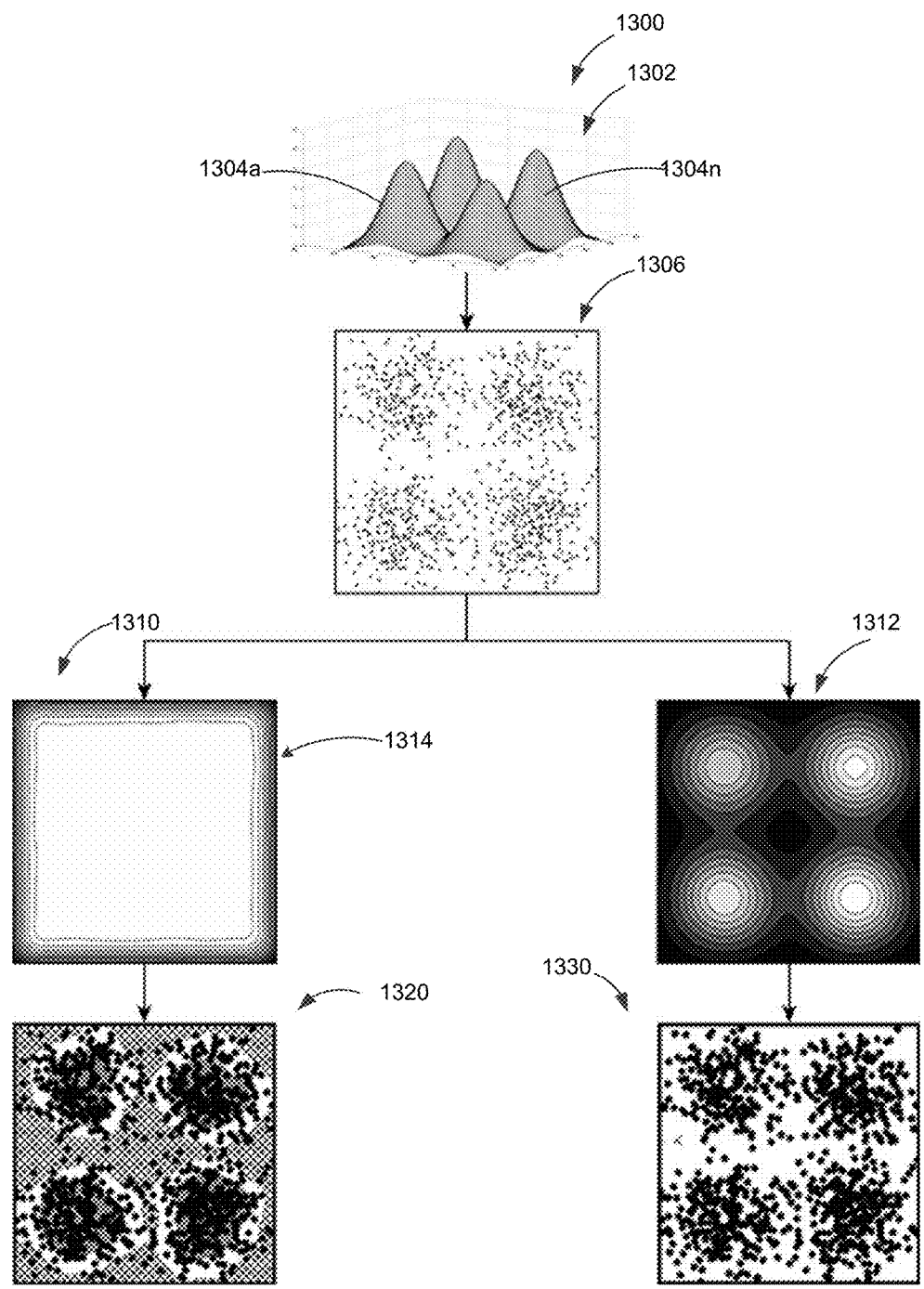
FIG. 13 is a flow diagram showing a goodness-of-fit test of a non-random distribution according to one aspect of the invention.

Now referring to FIG. 13, a visual flowchart 1300 illustrates testing a point set for a goodness-of-fit against two null hypotheses. A first null hypothesis includes data which are spatially random and the second hypothesis includes data comes from a distribution 1302. Distribution 1302 includes four Gaussians 1304a-1304n with different specified heights. Data is sampled from distribution 1302.

Point set 1306 includes 1,000 points drawn from distribution 1302. A visualization 1310 illustrates mean scores of every element calculated from 1,000 simulations of complete spatial randomness. Below visualization 1310, visualization 1320 shows the computed using p-values calculated from kernel density estimates of the score distribution of every element. In this example, a false discovery rate of 0.05 was used.

A visualization 1312 includes mean scores of every element calculated from 1,000 simulations drawn from the initial distribution of four Gaussians 1304a-1304n. It is noted that the shape of the simulated distribution approximates the shape of the real distribution well. Visualization 1330 includes elements using p-values, computed as before with kernel density estimation and the Benjamini-Hochberg method for controlling FDR (FDR=0.05). The visual flowchart 1300 demonstrates that the QAV system is robust and tends to produce accurate results when comparing a point data set to a true null hypothesis.

The embodiments of the invention can be implemented as software, hardware, or a combination. For example, the software can be implemented on a computer, and the network can be navigated with a mouse. The software can also be implemented on a device with a touch screen to allow for navigation, zooming, and panning by touching the visualized data. Another embodiment of the visualization process is to create a software application within which one can drop in point data sets, and then select parameters which control the analysis and visualization.

Other embodiments include using a heat map-style display to visualize the data on a computer monitor or other display device. Elements with significantly high density (based on the comparison step) are displayed in one color (e.g. red), elements with significantly low density are displayed in another color (e.g., blue), and all other elements are displayed in a third, neutral color (e.g., white). In other embodiments, different shades or colors can be used to denote higher or lower significance levels.

Optimization of the analysis can include: optimizing the number of Monte Carlo simulations needed to provide more accurate results; optimizing the parameters of the scan, such as the size and shape of the domain of the kernel or the weighting method used to count the points (e.g., all points contribute to the score equally, or the contributions are weighted based on some factor); and optimizing the grid size and shape, for example, a grid overlaid on a map or a cell, can be made smaller or larger to change the accuracy of the method or the speed of the computations.

Self-optimization of the variable parameters is provided in certain embodiments. There are multiple parameters associated with the method, especially the number of simulations and the size (radius) of the kernel. To optimize the number of simulations, a new set of points can be simulated and scores determined. The process is repeated until the expected value of the score (or upper and lower thresholds, or p-values, or some other parameter) has converged at every element, or a certain number of elements, within a specified tolerance. To optimize the radius, the method is repeated multiple times using a simulated data set as the "real" data set and it is determined which radius minimizes the number of elements identified as significant. Then the optimal radius is applied to the original real data. However, sometimes the optimal radius is the one that fits the size of what is being identified (i.e., if searching for small objects/clusters, use a small radius).

The real points are identified (but in some cases will ha an error of assignment associated with them). In some applications, the location of an event is identified with some amount of uncertainty that can be quantified. If that is the case, then the points can be treated not as a single spike on the landscape (i.e. no uncertainty) but as a function, typically a Gaussian, that describes the probability of the event having occurred at any location in the domain of the function. Instead of simply weighting the point as a simple function of, for example, distance, the kernel would essentially be convolved with the position uncertainty functions of the different points. The degree of overlap between the position function and the kernel would be quantified and used as the score.

In other embodiments, instead of comparing the real data to a uniform random distribution (e.g. for spatial randomness) the real data could be compared to another non-uniform distribution. For instance, in the crime maps of FIGS. 12 and 13, the simulated points could be distributed in a gradient that would reflect the population density. In this way the program would test if the crime correlates with the population or not. The comparison data could be a series of points or any type of gradient. It is understood that the data (point process) can be compared to other spatial data and is not limited to spatial randomness. A strong correlation of the two (or anti-correlations) would imply links between the groups. Comparisons (which are often like comparing two different mountains ranges) are difficult if impossible to do well by visual inspection and are not possible with simple mathematical descriptions which are usually designed for one variable.

Marked Processes

The data point sets will often contain other information or metadata. This information may be used to subsample the data point set to see if the spatial patterns are different between two groups or between one group and the whole. For instance, in the crime maps, the race or sex of the victim can be used to test if the spatial maps vary with these factors (e.g., is the crime spatially segregated by race?). Using techniques described herein, it is possible to drill down on the data and test what factors are key determinants in the spatial distribution.

Models used for simulation can be based on additional data or marks associated with the points (e.g. time information, X, Y, Z parameters or a number associated with the point) or can be based on a general 'covariate' (e.g., this can be seen as the shape of the landscape). If the Poisson distribution is flat, a covariate distribution can be sloped, lumpy, or resemble a step function.

A marked point process works similarly to the regular method, except that there are multiple subsets of points, and the distribution of one subset is compared to the distribution of another. For example, let m points be of type A and n points be of type B. If a determination whether B is the same as A is made, a probability distribution describing the point process of A is determined by computing the local density of the type A points around each element. This could be done using bootstrapping and other resampling methods. Then analysis steps are performed using the n type B points as the real data points and producing at least one simulated point set by sampling from the type A distribution just computed.

The visualization of the identification of clusters and exclusion zones can also have additional features such as coloring or using other visual indicia which are modified to emphasize different elements of the data, for example, multiple shades of red and blue can be used to indicate the confidence level of the clustering or exclusion at an element. Alternatively, a different heat map display could be used that visualizes the significance of all elements, not only those in the hot spots and cold spots. Instead of directly visualizing the scores or densities as in a simple heat map, the rank of the score relative to the simulated scores could be computed, for example by computing the percentile rank of the score or by computing the probability of a lower score occurring at that element (similar to the p-value, except ranging from 0 to 1 rather than 0 to 0.5). Then, the rank of each element would be visualized to produce a heat map type of display, rather than only visualizing the significant elements.

The device(s) or computer systems that integrate with the processor(s) may include, for example, a personal computer(s), workstation(s) (e.g., Sun, HP), personal digital assistant(s) (PDA(s)), handheld device(s) such as cellular telephone(s), laptop(s), handheld computer(s), or another device(s) capable of being integrated with a processor(s) that may operate as provided herein. Accordingly, the devices provided herein are not exhaustive and are provided for illustration and not limitation. References to "a microprocessor" and "a processor", or "the microprocessor" and "the processor," may be understood to include one or more microprocessors that may communicate in a stand-alone and/or a distributed environment(s), and may thus be configured to communicate via wired or wireless communications with other processors, where such one or more processor may be configured to operate on one or more processor-controlled devices that may be similar or different devices. Use of such "microprocessor" or "processor" terminology may thus also be understood to include a central processing unit, an arithmetic logic unit, an application-specific integrated circuit (IC), and/or a task engine, with such examples provided for illustration and not limitation.

Furthermore, references to memory, unless otherwise specified, may include one or more processor-readable and accessible memory elements and/or components that may be internal to the processor-controlled device, external to the processor-controlled device, and/or may be accessed via a wired or wireless network using a variety of communications protocols, and unless otherwise specified, may be arranged to include a combination of external and internal memory devices, where such memory may be contiguous and/or partitioned based on the application. Accordingly, references to a database may be understood to include one or more memory associations, where such references may include commercially available database products (e.g., SQL, Informix, Oracle) and also proprietary databases, and may also include other structures for associating memory such as links, queues, graphs, trees, with such structures provided for illustration and not limitation.

References to a computer network, unless provided otherwise, may include one or more intranets and/or the Internet, as well as a virtual network. References herein to microprocessor instructions or microprocessor-executable instructions, in accordance with the above, may be understood to include programmable hardware.

Unless otherwise stated, use of the word "substantially" may be construed to include a precise relationship, condition, arrangement, orientation, and/or other characteristic, and deviations thereof as understood by one of ordinary skill in the art, to the extent that such deviations do not materially affect the disclosed methods and systems. Throughout the entirety of the present disclosure, use of the articles "a" or "an" to modify a noun may be understood to be used for convenience and to include one, or more than one of the modified noun, unless otherwise specifically stated.

Elements, components, modules, and/or parts thereof that are described and/or otherwise portrayed through the figures to communicate with, be associated with, and/or be based on, something else, may be understood to so communicate, be associated with, and or be based on in a direct and/or indirect manner, unless otherwise stipulated herein.

Although the methods and systems have been described relative to a specific embodiment thereof, they are not so limited. Obviously many modifications and variations may become apparent in light of the above teachings. Many additional changes in the details, materials, and arrangement of parts, herein described and illustrated, may be made by those skilled in the art.

Having described preferred embodiments of the invention it will now become apparent to those of ordinary skill in the art that other embodiments incorporating these concepts may be used. Additionally, the software included as part of the invention may be embodied in a computer program product that includes a computer useable medium. For example, such a computer usable medium can include a readable memory device, such as a hard drive device, a CD-ROM, or a DVD-ROM, having computer readable program code segments stored thereon. The computer readable medium can also include a communications link, either optical, wired, or wireless, having program code segments carried thereon as digital or analog signals. Accordingly, it is submitted that that the invention should not be limited to the described embodiments but rather should be limited only by the spirit and scope of the appended claims.

What is claimed is:

1. A computer implemented method for analyzing spatial point patterns in a region comprising:
    receiving a point set;
    simulating at least one point set within the region using a point process;
    dividing the region into a plurality of elements;
    determining a first score for each element of the plurality of elements by weighting the point set within a domain of a predetermined kernel;
    determining a second score for each element by weighting the at least one simulated point set within the domain of the predetermined kernel;
    comparing, for each element of the plurality of elements, the first score to the second score by either:
        computing confidence intervals, based at least in part on the second score, for at least one confidence level having a predetermined statistical significance; or
        computing p-values, based at least in part on the second score, and
    comparing the first score to a predetermined statistical significance; and
    visualizing at least one of the plurality of elements having a higher score relative to the corresponding confidence intervals as belonging to a cluster and at least one of the plurality of elements having a lower score relative to the corresponding confidence intervals as belonging to an exclusion zone.

2. The computer implemented method of claim 1, wherein the predetermined kernel is one of:
    a continuous kernel; and
    a discrete kernel.

3. The computer implemented method of claim 2, wherein the domain of the kernel is isotropic having a radius greater than the radius of each of the plurality of elements.

4. The computer implemented method of claim 3, wherein weighting the point set comprises counting the number of points within the domain of the predetermined kernel centered on the element.

5. The computer implemented method of claim 1, wherein the plurality of elements correspond to a plurality of pixels to be visualized.

6. The computer implemented method of claim 1 further comprising:
    varying at least one parameter related to one of:
        the region division;
        the simulation;
        the first score determination;
        the second score determination; and
    repeating determining a first score, determining a second score, and
    comparing the first score to the second score to optimize the statistical significance in a visualization of one of:
        a cluster; and
        an exclusion zone.

7. The computer implemented method of claim 1, wherein the predetermined kernel has a domain comprising a Gaussian shape around a point within the element.

8. The computer implemented method of claim 1, wherein determining a first score for each element of the plurality of elements by weighting the point set within a domain of a predetermined kernel comprises using one of:
    a top hat weighting function;
    a bell-shaped Gaussian weighting function;
    a conical weighting function; and
    a parabolic weighting function.

9. The computer implemented method of claim 1, wherein the point process is a Poisson point process.

10. The computer implemented method of claim 1, wherein the point process simulating at least one point set within the region includes a distribution based on one of:
    a covariate dataset;
    a dataset having a non-uniform distribution; and
    a marked dataset.

11. The computer implemented method of claim 1, wherein each of the plurality of elements includes multiple dimensions.

12. The computer implemented method of claim 1, wherein simulating at least one point set comprises using random samples drawn from a predetermined distribution.

13. The computer implemented method of claim 1, wherein the point set comprises a distribution of exocytosis events in cells.

14. The computer implemented method of claim 1 further comprising testing the point set for a goodness-of-fit of a non-random distribution.

15. A computer program product including a non-transitory computer-storage medium having instructions stored thereon for processing data information, such that the instructions, when carried out by a processing device, cause the processing device to perform operations of:
   receiving a point set;
   simulating at least one point set within the region using a point process;
   dividing the region into a plurality of elements;
   determining a first score for each element of the plurality of elements by weighting the point set within a domain of a predetermined kernel;
   determining a second score for each element by weighting the at least one simulated point set within the domain of the predetermined kernel;
   comparing, for each element, the first score to the second score;
   computing confidence intervals for at least one confidence level having a predetermined statistical significance; and
   visualizing at least one of the plurality of elements having a higher score relative to one of the confidence intervals as belonging to a cluster and at least one of the plurality of elements having a lower score relative to a different confidence interval as belonging to an exclusion zone.

16. A system for analyzing spatial point patterns in a region comprising:
   a host processor coupled to memory, the memory storing instructions that when executed on the host processor cause the system to perform:
   receiving a point set;
   simulating at least one point set within the region using a point process;
   dividing the region into a plurality of elements;
   determining a first score for each element of the plurality of elements by weighting the point set within a domain of a predetermined kernel;
   determining a second score for each element by weighting the at least one simulated point set within the domain of the predetermined kernel;
   comparing, for each element, the first score to the second score;
   computing confidence intervals for at least one confidence level having a predetermined statistical significance; and
   visualizing at least one of the plurality of elements having a higher score relative to one of the confidence intervals as belonging to a cluster and at least one of the plurality of elements having a lower score relative to a different confidence interval as belonging to an exclusion zone.

* * * * *